US007406762B2

(12) United States Patent
Lu

(10) Patent No.: US 7,406,762 B2
(45) Date of Patent: Aug. 5, 2008

(54) METHOD OF FABRICATING AN ELECTRICAL TERMINAL CONNECTOR

(75) Inventor: Yuan-Feng Lu, Chang Hwa (TW)

(73) Assignee: K.S. Terminals, Inc., Chang Hwa (TW)

( * ) Notice: Subject to any disclaimer, the term of this patent is extended or adjusted under 35 U.S.C. 154(b) by 0 days.

(21) Appl. No.: 11/717,752

(22) Filed: Mar. 14, 2007

(65) Prior Publication Data

US 2007/0226999 A1 Oct. 4, 2007

Related U.S. Application Data

(62) Division of application No. 11/510,595, filed on Aug. 28, 2006, now Pat. No. 7,318,743.

(30) Foreign Application Priority Data

Mar. 31, 2006 (TW) ............................. 95111626 A

(51) Int. Cl.
*H01R 9/00* (2006.01)
*H05K 3/00* (2006.01)

(52) U.S. Cl. ............................ 29/844; 29/507; 29/523; 29/857; 29/862; 439/694; 439/881

(58) Field of Classification Search ................... 29/842, 29/844, 852, 854, 857, 861, 862, 864, 876, 29/882, 884, 506–508, 522.1, 523; 439/694, 439/881, 877, 902, 456
See application file for complete search history.

(56) References Cited

U.S. PATENT DOCUMENTS 3,332,053 A 7/1967 Busler
3,675,180 A * 7/1972 Podmore .................... 439/877
3,813,636 A * 5/1974 Mason ....................... 439/460
3,953,103 A * 4/1976 Mathis ....................... 439/866
4,348,070 A * 9/1982 Simon ........................ 439/586
5,203,726 A * 4/1993 Quinn ........................ 439/867
6,109,975 A 8/2000 Nitta
6,388,191 B1 5/2002 Maegawa
2004/0018783 A1* 1/2004 Foster et al. ................ 439/877
2007/0232125 A1* 10/2007 Lu ............................. 439/456

FOREIGN PATENT DOCUMENTS

EP 4146 A1 * 9/1979

* cited by examiner

*Primary Examiner*—Donghai D. Nguyen
(74) *Attorney, Agent, or Firm*—Ming Chow; Sinorica, LLC

(57) ABSTRACT

A fabricating method of an electrical terminal connector comprises the following steps: (1) providing an angled insulating housing having a first opening, a second opening and a through passage therein, the insulating housing further including a window and a cover; (2) providing a conducting terminal which has a flat-end connecting portion facing the first opening and a crimped portion facing the second opening; (3) providing a deformable crimp ferrule which has a core-connecting end and a crimping end facing the conducting terminal; (4) assembling conducting terminal with the deformable crimp ferrule; (5) placing the assembly of the conducting terminal and the deformable crimp ferrule through the window in the passage of the insulating housing, then fastening the cover with the window.

2 Claims, 7 Drawing Sheets

METHOD OF FABRICATING AN ELECTRICAL TERMINAL CONNECTOR

CROSS-REFERENCE TO RELATED APPLICATION

This application is a Divisional application of U.S. application Ser. No. 11/510,595 filed Aug. 28, 2006 now U.S. Pat. No. 7,318,743. Priority is claimed based on U.S. application Ser. No. 11/510,595 filed Aug. 28, 2006, which claims the priority of Republic of China Patent Application No. 095111626 filed on Mar. 31, 2006, all of which is incorporated by reference.

BACKGROUND OF THE INVENTION

Referring to FIG. 1A, the prior art U.S. Pat. No. 4,298,243 shows an electrical connector for connecting two kinds of electrical conducting terminals. There is only one conducting element 6A located inside the insulating housing 8A. The conducting element 6A connects a flat-type conducting terminal to a conducting core. Wherein the conducting core is directly inserted into the cylindrical crimp ferrule 14A at the end of the conducting element 6A. An external clamping force is then exerted to deform the cylindrical crimp ferrule 14A to fasten the conducting core; therefore, the connecting force between the conducting core and the conducting element 6A is weak. Meanwhile, the conducting element 6A sticks out and inserts into the insulating housing 8A by an inverting hook 12A; consequently, it is inconvenient for the overall assembly of the connector.

Referring to FIGS. 1B and 1C, another example of the prior art shown in U.S. Pat. No. 5,203,726 is an electrical terminal connector capable of connecting two kinds of terminals. Besides the metallic terminal 14B (FIG. 1B), a crimp portion 16C (FIG. 1C) is introduced to connect the conducting core for increasing the connecting force of the conducting core and the metallic terminal 14B. When assembling the connector, the front part 44C of crimp portion 16C surrounds the crimping end 30B of the metallic terminal 14B from a breach 50B and props up the ramp 40B tightly. The stress concentration also occurs near the intersection of the breach 50B and the ramp 40B to reduce the combining strength of the metallic terminal and the crimp portion 16C.

Referring to FIG. 1D, another example of the prior art shown in U.S. Pat. No. 6,997,746 shows a conducting element 50D connecting to two electrical terminals. In order to connect the conducting core without any additional cylindrical crimp ferrule, the structure of the conducting element 50D is very complicated and not easy to fabricate.

FIELD OF THE INVENTION

The present invention relates to an electrical terminal connector that connects two kinds of conducting terminals: a flat type and a wire type that has an insulating cladding and an exposed conducting core. More particularly, the present invention relates to a connector that does not expose the conducting terminals thereof after connection therefore to provide better insulation.

SUMMARY OF THE INVENTION

The present invention provides an electrical terminal connector to improve the aforementioned problems of the prior arts. The electrical terminal connector includes an angled insulating housing, a conducting terminal and a deformable cylindrical crimp ferrule within insulating housing. Two ends of the angled insulating housing are a first opening and a second opening, and a through passage provided therein. The conducting terminal has a flat-ended connecting portion facing the first opening, and a crimped portion facing the second opening. A deformable cylindrical crimp ferrule integrally formed has a core-connecting end facing the second opening and a crimping end facing the crimped portion of the conducting terminal. Wherein, the insulating housing further includes a window and a cover. pivoted on one side of the window, while the other end of the cover has a fastening means. The fastening means affixes to the window to form an open position and a closed position. The crimped portion of the conducting terminal extends towards the second opening with an elongation. The elongation comprises an axial slit to tolerate a radial deformation. The crimping end of the cylindrical crimp ferrule has a diameter slightly larger than that of the elongation of the conducting terminal.

Therefore, the main object of the invention is to provide an electrical terminal connector that is easier to fabricate than the prior art.

Another object of this invention is to provide an electrical terminal connector, wherein the conducting terminals and the connector have a better combination.

Another object of this invention is to provide an electrical terminal connector having a better combination between the internal conducting elements.

And yet another object of this invention is to provide an electrical terminal connector having better structural strength.

And yet another object of this invention is to provide an insulating housing which has an window means to make assembly easier.

And yet another object of this invention is to provide an electrical terminal connector, wherein the conducting elements have better structural strength.

And yet another object of this invention is to provide an electrical terminal connector improved on insertion of the external wire.

DETAILED DESCRIPTION OF THE PREFERRED EMBODIMENTS

The present invention discloses an electrical terminal connector, wherein some of the basic electrical wire elements and insulating principles are described in the prior art, and therefore will not be described in detail below. Simultaneously, the drawings shown in this specification express the characteristics of this invention without actual dimensions.

The electrical terminal connector of this invention includes an angled insulating housing 2. Inside the insulating housing 2, there are a conducting terminal 3 and a deformable cylindrical crimp ferrule 4 to be assembled to each other.

Figure 1A:
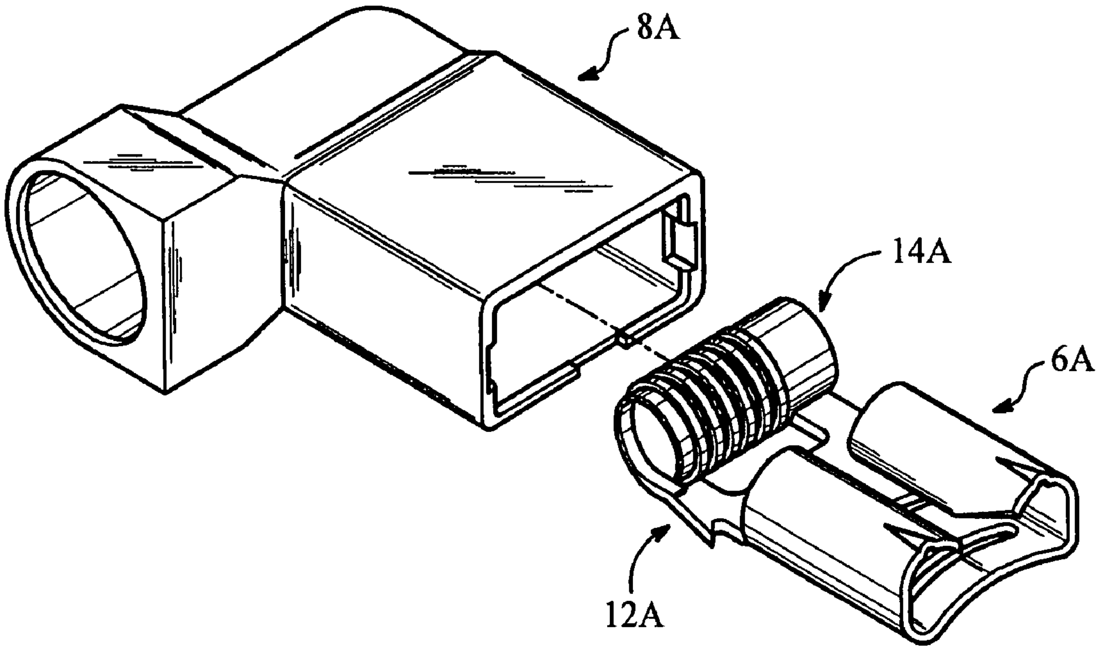
FIG. 1A (Prior Art)
FIG. 1A is an exploded view of the insulating housing and conducting terminal of the prior art (U.S. Pat. No. 4,298,243).
Figure 1B:
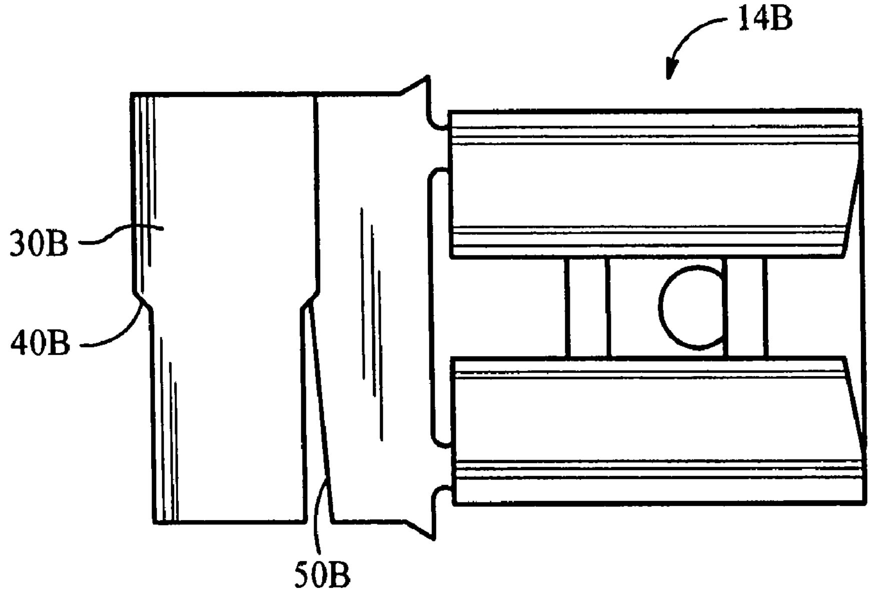
FIG. 1B (Prior Art)
FIG. 1B is a top view drawing of the conducting terminal of the prior art (U.S. Pat. No. 5,203,726).
Figure 1:
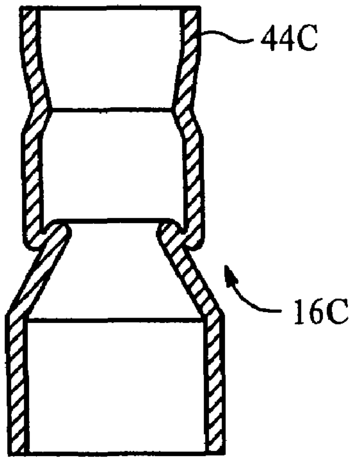
F I G . 1 C ( Prior Art )
FIG. 1C is a sectional view of the cylindrical crimp ferrule of the prior art (U.S. Pat. No. 5,203,726).
FIG. 1D is a three-dimensional view of the conducting terminal of the prior art (U.S. Pat. No. 6,997,746).
Figure 1:
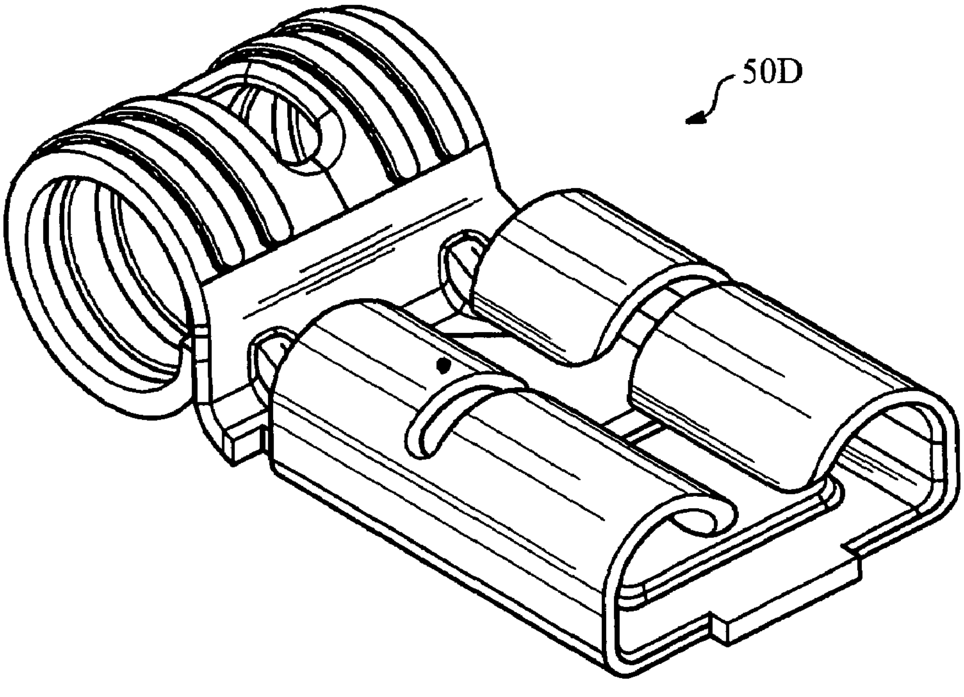
F I G . 1 D ( Prior Art )
Figure 2A:
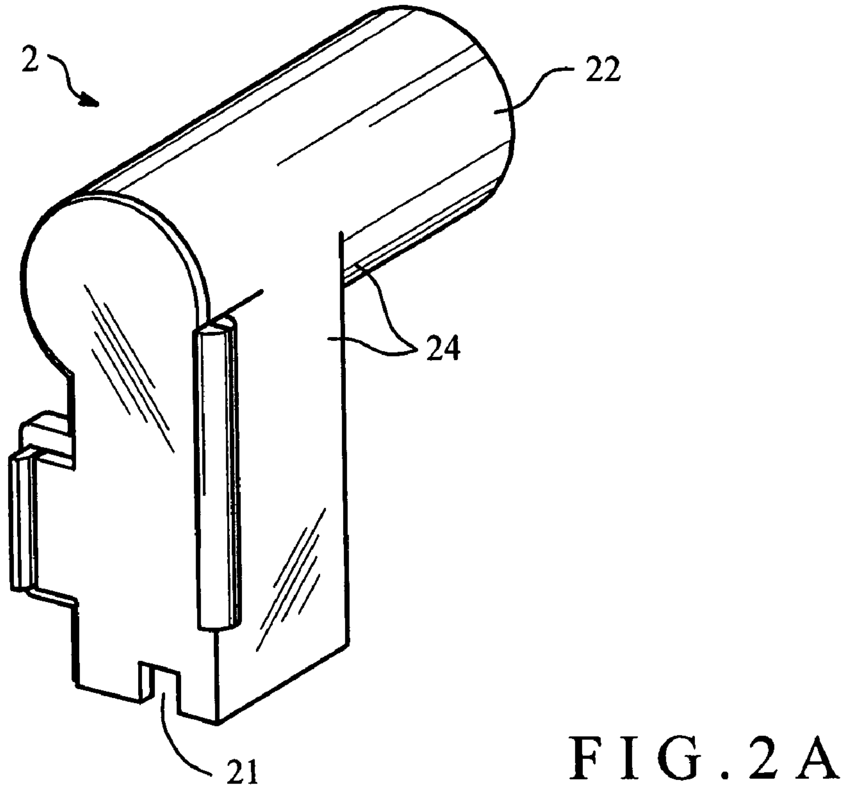
FIG. 2A and FIG. 2B are three-dimensional views of a preferred embodiment of the insulating housing.
Figure 2B:
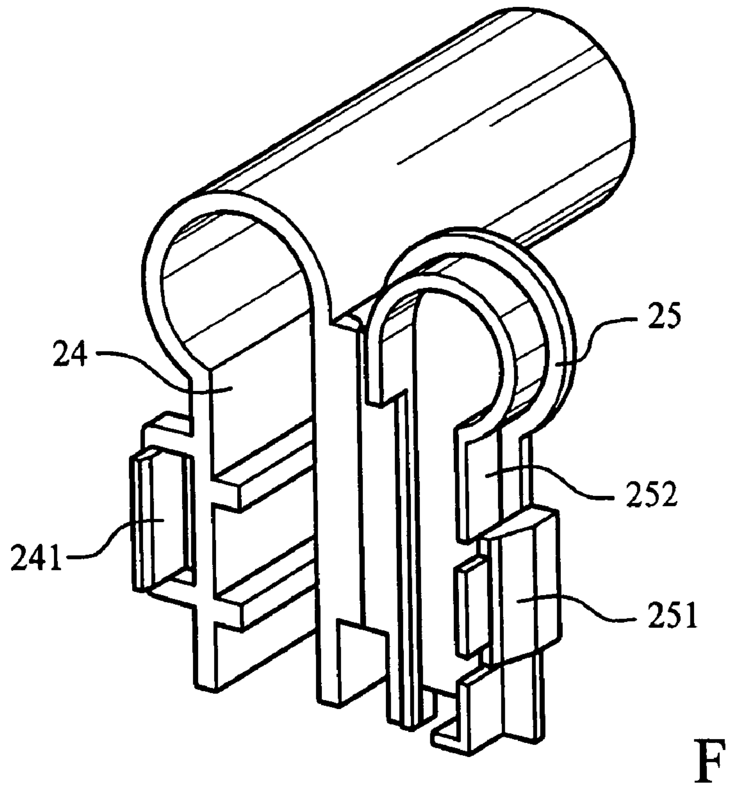

Referring to FIGS. 2A and 2B, the preferred embodiment of the insulating housing 2 of this invention is shown.

As shown in FIG. 2A, the insulating housing 2 has an angled structure 24. Two ends of the angled structure 24 are a first opening 21 and a second opening 22. Additionally, there is a through passage therein the insulated housing 2.

Referring to FIG. 2B, in a preferred embodiment, the insulating housing 2 further includes a window 24 and a cover 25 on the side wall of the housing 2 adjacent to the first opening 21. The cover 25 pivots on the side of the window 24. The area of cover 25 is slightly larger than that of window 24 to provide electrical arc protection. A fastening means 251 is located on the other end of the cover and can be fastened to the matching means 241 of window 24 to operatically form an opening position and a closed position. In a preferred embodiment, the cover 25 facing the window 24 is extended with a flange 252 to provide electrical arc protection when window 24 and cover 25 are in the closed position. Accordingly, better shielding effects prevent the insulating housing 2 from electric arc leakage when terminal 3 conducts.

Figure 3:
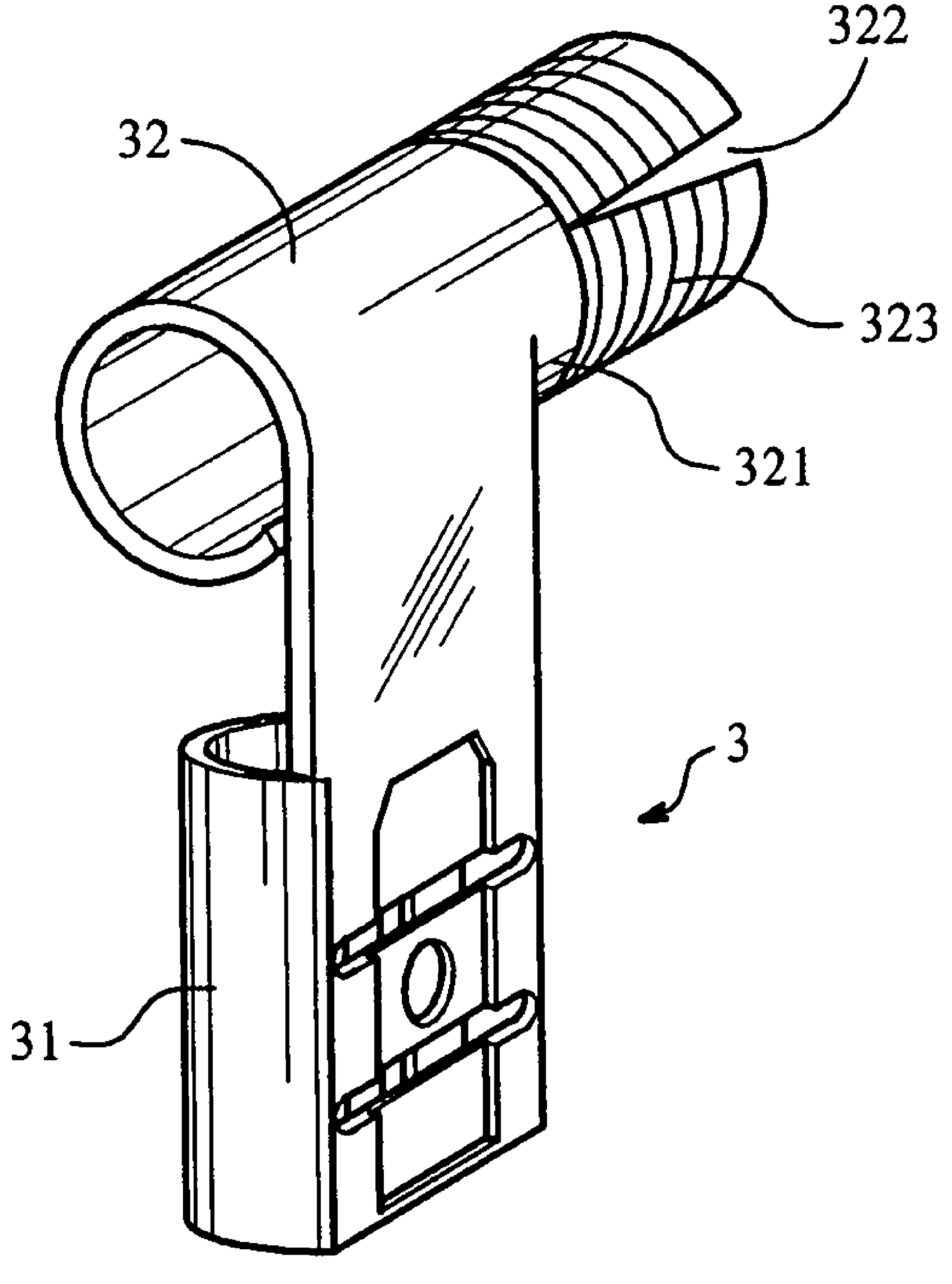
FIG. 3 is an exploded view of a preferred embodiment of the conducting terminal.

Referring to FIG. 3, a preferred embodiment of the conducting terminal 3 of the present invention is shown.

The conducting terminal 3 positioned in the passage of the insulating housing 2 has a flat-end connecting portion 31 facing the first opening 21 and a crimped portion 32 facing the second opening 22. The flat-end connecting portion 31 is for the external conducting terminal in flat shape to insert therein, while the crimped portion 32 is for assembling the crimp ferrule 4. The crimped portion 32 facing the second opening 22 is extended with an elongation 321 in order to being easily assembled in the crimp ferrule 4.

In a preferred embodiment, the elongation 321 portion comprises an axial slit 322 to tolerate radial deformation to provide better insertion when assemblied.

In another preferred embodiment, the elongation 321 facing the second opening 22 further comprises with at least one annular crimping groove 323 to provide a better combination of the elongation 321 portion and the crimp ferrule 4.

Figure 4A:
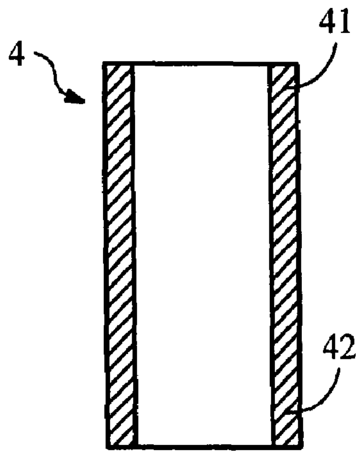
FIG. 4A is a sectional view of a preferred embodiment of deformable cylindrical crimp ferrule.

Referring to FIG. 4A, a preferred embodiment of the deformable crimp ferrule 4 of the present invention is shown.

The deformable crimp ferrule 4 positioned in the passage of the insulating housing 2 is integrally formed in cylindrical shape. The deformable crimp ferrule 4 has a core-connecting end 42 facing the second opening 22 and a crimping end 41 facing the conducting terminal. The core-connecting end 42 is for connecting the conducting core of the external wire, while the crimping end 41 is for the insertion of the elongation 321. In a preferred embodiment, the diameter of the crimping end 41 is slightly larger than that of the elongation 321 to make the insertion easier. The crimping end 41 and the elongation 321 are partially deformed to assembled.

Figure 4B:
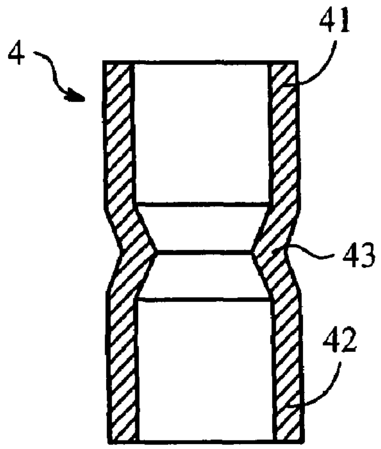
FIG. 4B is a sectional view of another preferred embodiment of deformable cylindrical crimp ferrule.

Refer to FIG. 4B, another embodiment of the crimp ferrule 4 of the present invention is shown. The crimp ferrule 4 comprises an indented groove 43 near the midpoint so that the insulating cladding of the inserted wire is limited by the indented groove 43 and only the conducting core is allowed to enter the indented groove 43, Hence, the better positioning of the wire is achieved.

Figure 4C:
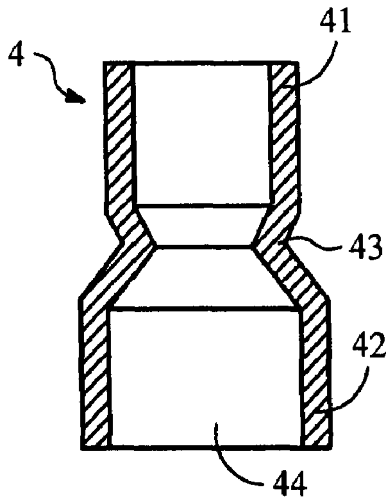
FIG. 4C is a sectional view of yet another preferred embodiment of deformable cylindrical crimp ferrule.

Referring to FIG. 4C, another preferred embodiment of the crimp ferrule 4 of the present invention is shown. A radial enlarging portion 44 further comprises between the core-ended connecting portion 42 and the indented groove 43. The radial enlarging area 44 allows an external wire to be easily inserted. After the insertion, the core end can pass through the indented groove 43. The insulating cladding of the wire is limited by the indented groove 43 so the wire can be easily positioned.

Figure 5:
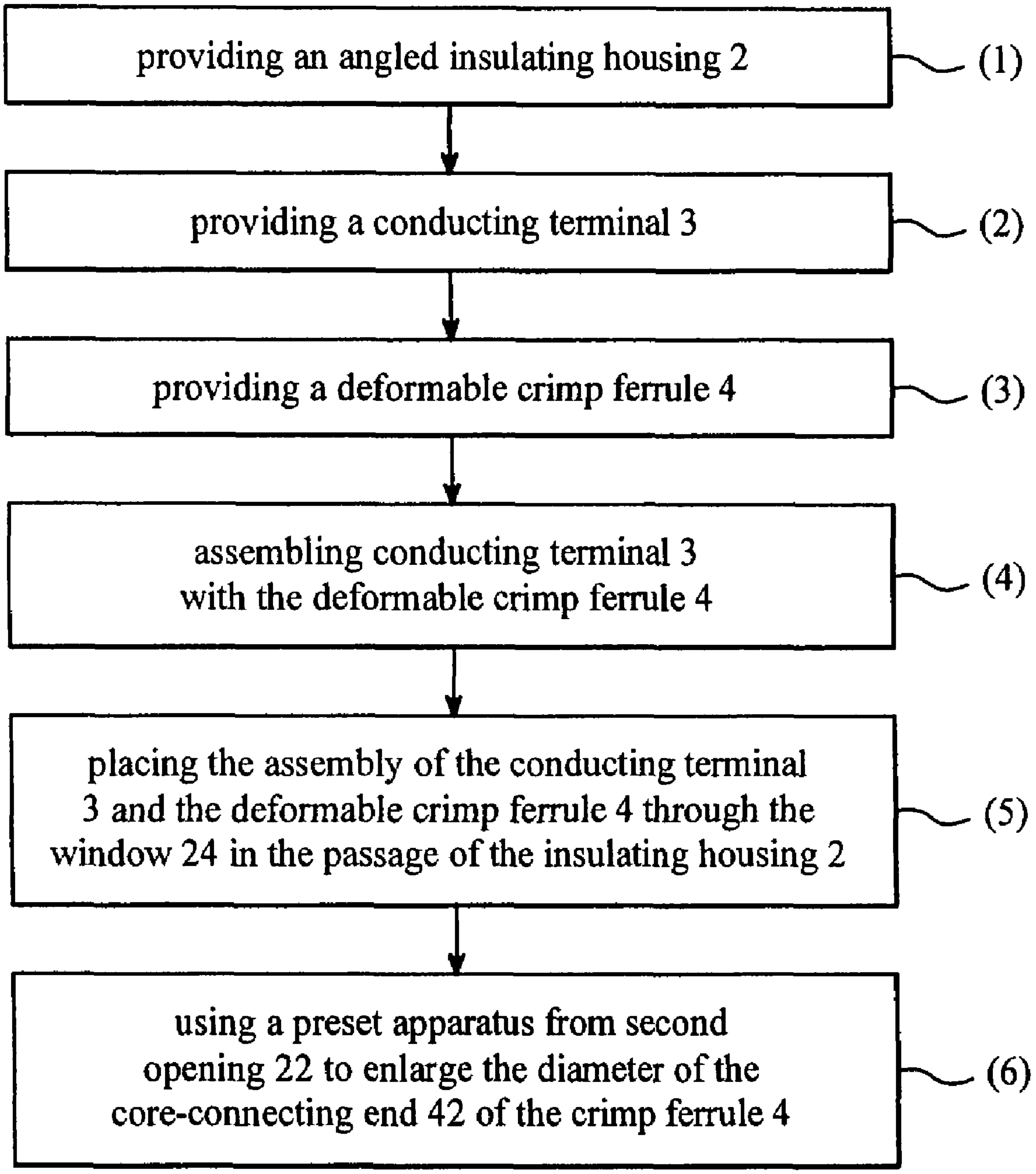
FIG. 5 is a flowchart of the connector fabricating process of this invention.
Figure 6:
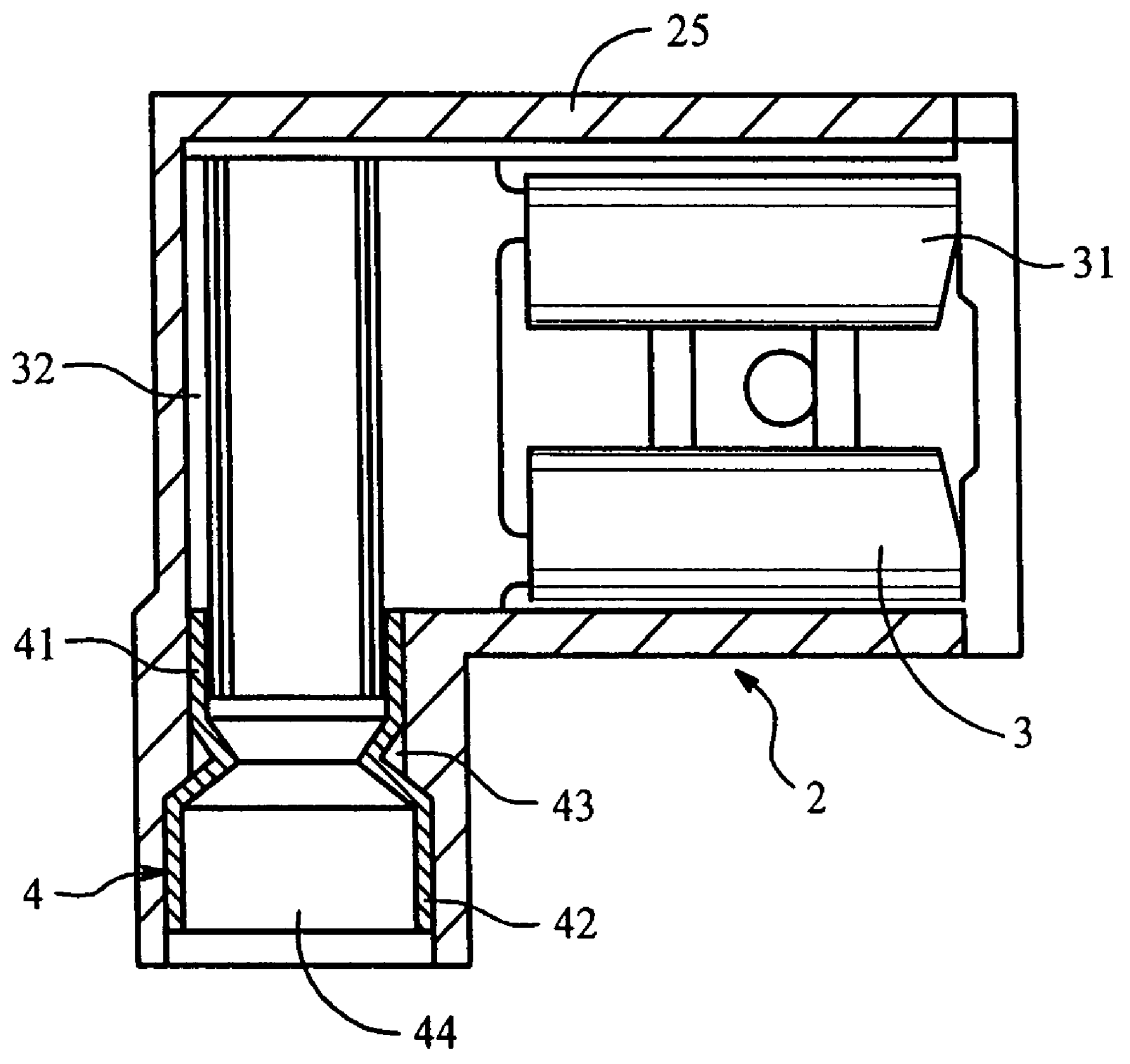
FIG. 6 is a sectional view of the assembled connector of this invention.

Refer to FIG. 5. In order to achieve the aforementioned electrical terminal connector, the present invention further comprising the fabricating method thereof including the following steps:

(1) Providing an angled insulating housing 2 which has a first opening 21, a second opening 22 and a through passage therein, the insulating housing 2 further including a window 24 and a cover 25 on the side wall of the housing 2 adjacent to the first opening 21, the cover 25 pivoted on the side of the window 24, the cover 25 slightly larger than that of window 24 to provide electrical arc protection, a fastening means 251 located on the other end of the cover and fastened to the matching means 241 of window 24 to operatically form an opening position and a closed position, the cover 25 facing the window 24 extended with a flange 252 to provide electrical arc protection when window 24 and cover 25 in the closed position;

(2) providing a conducting terminal 3 which has a flat-end connecting portion 31 facing the first opening 21 and a crimped portion 32 facing the second opening 22, the flat-end connecting portion 31 for the external conducting terminal in flat shape to insert therein, while the crimped portion 32 for assembling the crimp ferrule 4, the crimped portion 32 facing the second opening 22 extended with an elongation 321 in order to being easily assembled in the crimp ferrule 4, an axial slit 322 on the elongation 321 and at least one annular crimping groove 323 to tolerate radial deformation to provide better insertion when assemblied;

(3) providing a deformable crimp ferrule 4 which has a core-connecting end 42 and a crimping end 41 facing the conducting terminal, an indented groove 43 near the midpoint, the diameter of the crimping end 41 slightly larger than that of the elongation 321 to make the insertion easier;

(4) assembling conducting terminal 3 with the deformable crimp ferrule 4 by inserting the elongation 321 of the conducting terminal 3 in the crimping end 41 of the crimp ferrule 4 to cause a partial deformation for a better combination;

(5) placing the assembly of the conducting terminal 3 and the deformable crimp ferrule 4 through the window 24 in the passage of the insulating housing 2, then fastening the cover 25 with the window 24; and (6) enlarging the diameter of the core-connecting end 42 of the crimp ferrule 4, hence, an electrical terminal connector formed for connecting a flat conducting terminal and a conducting core with insulating cladding.

Although the preferred embodiments of the present invention are described above, it will be understood that various modifications, additions and substitutions may be made without departing from the scope and spirit of the invention. Accordingly, other embodiments are within the scope of following claims.

I claim:

1. A fabricating method of an electrical terminal connector comprising the following steps:

(1) providing an angled insulating housing which has a first opening, a second opening and a through passage therein, the insulating housing further including a window and a cover on a side wall of the housing at the first opening, the cover pivoted on a side of the window and comprised a flange extending from said cover facing said window to provide electrical arc protection when said window and said cover are in the closed position, a fastening means located on the other end of the cover and fastened to a matching means of window to operatically form an opening position and a closed position;

(2) providing a conducting terminal which has a flat-end connecting portion facing the first opening and a crimped portion facing the second opening, the flat-end connecting portion for an external conducting terminal in flat shape to insert therein, while the crimped portion for assembling a deformable crimp ferrule, the crimped portion facing the second opening extended with an elongation having an axial slit and at least on annular crimping groove in order to being easily assembly in the deformable crimp ferrule:

(3) providing the deformable crimp ferrule which has a core-connecting end and a crimping end facing the crimping portion of the conducting terminal, the diameter of the crimping end slightly larger than the diameter of the elongation to make an insertion of the elongated into the crimping end easier; and (4) assembling conducting terminal with the deformable crimp ferrule by inserting the elongation of the conducting terminal in the crimping end of the crimp ferrule to cause a partial deformation of the crimping end and the elongation for a better combination;

(5) placing the assembly of the conducting terminal and the deformable crimp ferrule through the window in the passage of the insulating housing, then fastening the cover with the window; and (6) enlarging the diameter of the core-connecting end of the crimp ferrule, hence, an electrical terminal connector formed for connecting the flat external conducting terminal and a conducting core with insulating cladding.

2. A fabricating method of an electrical terminal connector, comprising the following steps:

(1) providing an angled insulating housing which has a first opening, a second opening and a through passage therein, the insulating housing further including a window and a cover on the side wall of the housing adjacent to the first opening, the cover pivoted on a side of the window and is larger than an opening of said window to provide electrical arc protection when said window and said cover are in the closed position, a fastening means located on the other end of the cover and fastened to a matching means of window to operatically form an opening position and a closed position;

(2) providing a conducting terminal which has a flat-end connecting portion facing the first opening and a crimped portion facing the second opening, the flat-end connecting portion for an external conducting terminal in flat shape to insert therein, while the crimped portion for assembling a deformable crimp ferrule, the crimped portion facing the second opening extended with an elongation having an axial slit and at least on annular crimping groove in order to being easily assembly in the deformable crimp ferrule;

(3) providing the deformable crimp ferrule which has a core-connecting end and a crimping end facing the crimping portion of the conducting terminal, the diameter of the crimping end slightly larger than the diameter of the elongation to make an insertion of the elongated into the crimping end easier;

(4) assembling conducting terminal with the deformable crimp ferrule by inserting the elongation of the conducting terminal in the crimping end of the crimp ferrule to cause a partial deformation of the crimping end and the elongation for a better combination;

(5) placing the assembly of the conducting terminal and the deformable crimp ferrule through the window in the passage of the insulating housing, then fastening the cover with the window; and (6) enlarging the diameter of the core-connecting end of the crimp ferrule, hence, an electrical terminal connector formed for connecting the flat external conducting terminal and a conducting core with insulating cladding.

* * * * *